(12) United States Patent
Taguchi et al.

(10) Patent No.: US 10,438,865 B2
(45) Date of Patent: Oct. 8, 2019

(54) SEMICONDUCTOR DEVICE

(71) Applicant: Mitsubishi Electric Corporation, Tokyo (JP)

(72) Inventors: Koichi Taguchi, Tokyo (JP); Yuki Hata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/778,635

(22) PCT Filed: Feb. 4, 2016

(86) PCT No.: PCT/JP2016/053382
§ 371 (c)(1),
(2) Date: May 24, 2018

(87) PCT Pub. No.: WO2017/134799
PCT Pub. Date: Aug. 10, 2017

(65) Prior Publication Data
US 2018/0358279 A1 Dec. 13, 2018

(51) Int. Cl.
*H01L 23/367* (2006.01)
*H01L 23/24* (2006.01)
(Continued)

(52) U.S. Cl.
CPC .......... *H01L 23/367* (2013.01); *H01L 23/053* (2013.01); *H01L 23/24* (2013.01);
(Continued)

(58) Field of Classification Search
CPC ..... H01L 23/367; H01L 23/053; H01L 23/24; H01L 23/50; H01L 23/3735
(Continued)

(56) References Cited

U.S. PATENT DOCUMENTS 5,672,910 A 9/1997 Majumdar et al.
7,449,726 B2 * 11/2008 Nakanishi ............. H01L 23/562
257/150
(Continued)

FOREIGN PATENT DOCUMENTS

JP H09-153574 A 6/1997
JP 2003-007966 A 1/2003

OTHER PUBLICATIONS

International Search Report issued in PCT/JP2016/053382; dated Apr. 19, 2016.

*Primary Examiner* — Dao H Nguyen
(74) *Attorney, Agent, or Firm* — Studebaker & Brackett PC

(57) ABSTRACT

It is an object of the present invention to provide a semiconductor device that has sufficient insulation properties between a screw and a heat dissipation plate, and is smaller and less costly. A semiconductor device of the present invention includes the following: a housing containing a semiconductor element; a heat dissipation plate disposed on a bottom surface of the housing, and provided to partly extend beyond the housing to reach the outside; an electrode electrically connected to the semiconductor element, and provided to partly protrude from the housing to the outside in parallel with the heat dissipation plate; and a screw with which an exposed portion of the electrode, protruding from the housing is joined to a busbar. The heat dissipation plate has a thickness lack portion in a location of the heat dissipation plate, the location at least facing the screw, the location being on a screw side.

8 Claims, 2 Drawing Sheets

(51) Int. Cl.
*H01L 23/373* (2006.01)
*H01L 23/053* (2006.01)
*H01L 23/50* (2006.01)
*H01L 23/36* (2006.01)
*H01L 23/498* (2006.01)

(52) U.S. Cl.
CPC .......... *H01L 23/3735* (2013.01); *H01L 23/50* (2013.01); *H01L 23/36* (2013.01); *H01L 23/49811* (2013.01); *H01L 2224/73265* (2013.01)

(58) Field of Classification Search
USPC ............... 257/690, 691, 706, 707, 712, 200, 257/E23.039, E23.043, E23.084, E23.088, 257/E23.092, E23.124, E23.14, E25.016, 257/E21.502, E21.504; 438/112, 122, 438/123, 124
See application file for complete search history.

(56) References Cited

U.S. PATENT DOCUMENTS

| | | | |
|---|---|---|---|
| 7,892,893 B2* | 2/2011 | Obara | H01L 23/49861 257/676 |
| 8,436,459 B2* | 5/2013 | Oka | H01L 23/3735 257/691 |
| 2002/0190374 A1 | 12/2002 | Nakajima et al. | |
| 2005/0199999 A1* | 9/2005 | Shirasawa | H01L 23/053 257/706 |
| 2016/0111345 A1* | 4/2016 | Kawase | H01L 23/36 307/10.1 |

* cited by examiner

SEMICONDUCTOR DEVICE

TECHNICAL FIELD

The present invention relates to semiconductor devices, and particularly, to a power semiconductor device for power conversion.

BACKGROUND ART

The power semiconductor device includes an electrode protruding from a housing of the power semiconductor device to the outside. The electrode is joined to a busbar with a screw in a protruding location. Further, the power semiconductor device includes a heat dissipation plate made of metal to dissipate heat generated within the housing to the outside. The heat dissipation plate can protrude from the housing to the outside so as to be in parallel with the electrode. In this case, the power semiconductor device, which needs to have sufficient, electrical insulation properties between the screw and the heat dissipation plate, is limited to a thickness direction of the power semiconductor device. Unfortunately, this fails to achieve a smaller power semiconductor device.

To address this problem, conventionally disclosed is a technique in which an insulating sheet is disposed on a surface of the heat dissipation plate, the surface facing the screw, in order to achieve sufficient insulation properties between the screw and the heat dissipation plate (c.f., Patent Documents 1 and 2).

PRIOR ART DOCUMENTS

Patent Documents

Patent Document 1: Japanese Patent Application Laid-Open No. 2003-7966
Patent Document 2: Japanese Patent Application Laid-Open No. 9-153574

SUMMARY

Problem to be Solved by the Invention

In Patent Documents 1 and 2, the power semiconductor device includes the insulating sheet for sufficient insulation properties between the screw and the heat dissipation plate. This technique unfortunately involves an increase in cost.

The present invention has been made to solve this problem. It is an object of the present invention to provide a semiconductor device that has sufficient insulation properties between a screw and a heat dissipation plate, and is smaller and less costly.

Means to Solve the Problem

To solve the aforementioned problem, a semiconductor device according to one aspect of the present invention includes the following: a housing containing a semiconductor element; a heat dissipation plate disposed on a bottom surface of the housing, and provided to partly extend beyond the housing to reach the outside; an electrode electrically connected to the semiconductor element, and provided to partly protrude from the housing to the outside in parallel with the heat dissipation plate; and a screw with which an exposed portion of the electrode, protruding from the housing is joined to an external terminal. The heat dissipation plate has a thickness lack portion in a location of the heat dissipation plate, the location at least facing the screw, the location being on a screw side.

A semiconductor device according to another aspect of the present invention includes the following: a housing containing a semiconductor element; a heat dissipation plate disposed on a bottom surface of the housing, and provided to partly extend beyond the housing to reach the outside; an electrode electrically connected to the semiconductor element, and provided to partly protrude from the housing to the outside in parallel with the heat dissipation plate; and a screw with which an exposed portion of the electrode, protruding from the housing is joined to an external terminal. The heat dissipation plate is not disposed in a location of the heat dissipation plate, the location facing the screw.

Effects of the Invention

According to the one aspect of the present invention, the semiconductor device includes the following: the housing containing the semiconductor element; the heat dissipation plate disposed on the bottom surface of the housing, and provided to partly extend beyond the housing to reach the outside; the electrode electrically connected to the semiconductor element, and provided to partly protrude from the housing to the outside in parallel with the heat dissipation plate; and the screw with which the exposed portion of the electrode, protruding from the housing is joined to the external terminal. The heat dissipation plate has the thickness lack portion in the location of the heat dissipation plate, the location at least facing the screw, the location being on the screw side. The semiconductor device consequently has sufficient insulation properties between the screw and the heat dissipation plate, and is smaller and less costly.

Further, the semiconductor device includes the following: the housing containing the semiconductor element; the heat dissipation plate disposed on the bottom surface of the housing, and provided to partly extend beyond the housing to reach the outside; the electrode electrically connected to the semiconductor element, and provided to partly protrude from the housing to the outside in parallel with the heat dissipation plate; and the screw with which the exposed portion of the electrode, protruding from the housing is joined to the external terminal. The heat dissipation plate is not disposed in the location of the heat dissipation plate, the location facing the screw. The semiconductor device consequently has sufficient insulation properties between the screw and the heat dissipation plate, and is smaller and less costly.

These and other objects, features, aspects and advantages of the present invention will become more apparent from the following detailed description of the present invention when taken in conjunction with the accompanying drawings.

DESCRIPTION OF EMBODIMENT(S)

The following describes embodiments of the present invention with reference to the drawings.

<Fundamental Technique>

The following describes a technique that is fundamental to the present invention (herein after referred to as a fundamental technique).

Figure 5:
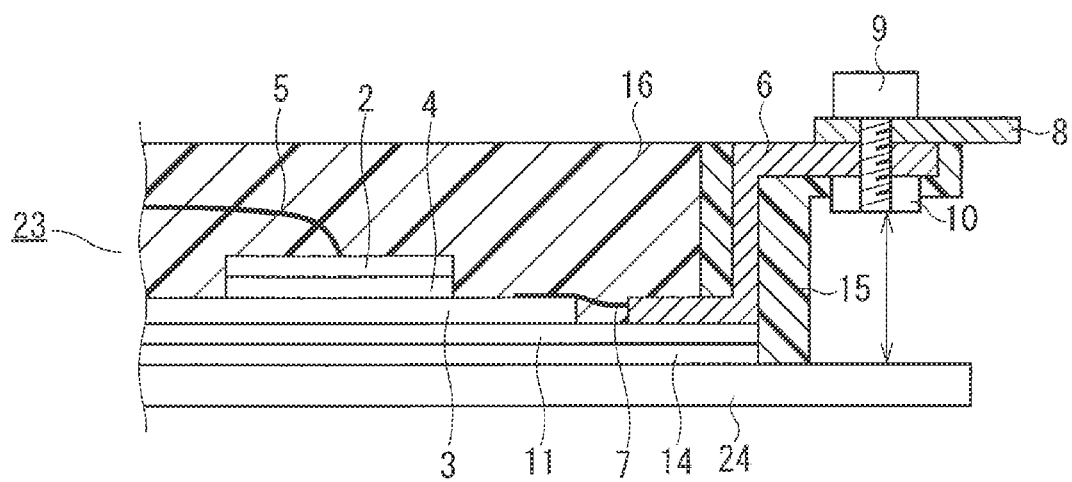
FIG. 5 is a diagram illustrating one example of a configuration of a semiconductor device according to a fundamental technique.

FIG. 5 is a diagram illustrating one example of a configuration of a semiconductor device 23 according to the fundamental technique, and is a cross-sectional view of the semiconductor device 23.

The semiconductor device 23 includes a housing 15 containing a semiconductor element 2, a metal pattern 3, a wire 5, an electrode 6, a wire 7, and an insulating substrate 11, and includes a heat dissipation plate 24 on a bottom surface (i.e., a surface in a lower part of the drawing sheet) of the semiconductor device 23. The inside of the housing 15 is sealed by a resin 16.

The semiconductor element 2 has one surface electrically connected to the metal pattern 3 through solder 4, and the other surface electrically connected to the wire 5. The metal pattern 3 and the electrode 6 are disposed on the insulating substrate 11, and electrically connected to each other through the wire 7.

The heat dissipation plate 24 has two surfaces: one is disposed on a surface of the insulating substrate 11 through solder 14, the surface being opposite a different surface of the insulating substrate 11, the different surface being provided with the metal pattern 3; and the other is exposed. Further, the heat dissipation plate 24 is disposed on a bottom surface of the housing 15, and provided to partly extend beyond the housing 15 to reach the outside.

The electrode 6 has one end exposed within the housing 15, and the other end protruding from the housing 15 to the outside in parallel with the heat dissipation plate 24. The other end of the electrode 6 has an exposed upper surface (i.e., a surface in the upper part of the drawing sheet). In this exposed portion, the electrode 6 is joined to a busbar 8 with a screw 9 and a nut 10. The busbar 8 is an external terminal through which an external voltage is applied across the semiconductor element 2, and through which an output of the semiconductor element 2 is transmit to the outside.

Such a configuration enables the heat dissipation plate 24 to efficiently dissipate heat generated within the housing 15 to the outside. Further, the semiconductor device 23, which includes the heat dissipation plate 24 and the resin 16, has a longer lifetime.

In the fundamental technique illustrated in FIG. 5, the semiconductor device 23 needs to have sufficient, electrical insulation properties between the screw 9 and the heat dissipation plate 24. Hence, the distance between the screw 9 and the heat dissipation plate 24 (i.e., a distance indicated by a bidirectional arrow in the drawing) is difficult to be reduced. That is, the semiconductor device 23 is limited to a thickness direction of the semiconductor device 23. Unfortunately, this fails to achieve a smaller semiconductor device.

To address this problem, Patent Documents 1 and 2 discloses a technique in which an insulating sheet is disposed on a surface of a heat dissipation plate, the surface facing a screw, in order to achieve sufficient insulation properties between the screw and the heat dissipation plate. This technique unfortunately involves an increase in cost.

The present invention has been made to solve this problem, and will be now detailed.

First Embodiment

Figure 1:
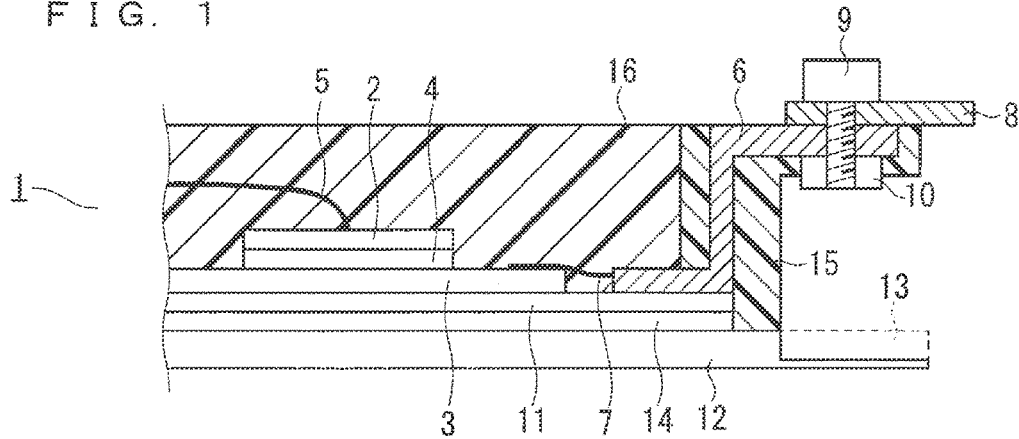
FIG. 1 is a diagram illustrating one example of a configuration of a semiconductor device according to a first embodiment of the present invention.

FIG. 1 is a diagram illustrating one example of a configuration of a semiconductor device 1 according to a first embodiment of the present invention, and is a cross-sectional view of the semiconductor device 1.

As illustrated in FIG. 1, the semiconductor device 1 according to the first embodiment includes a heat dissipation plate 12. The other components, which are the same as those in the fundamental technique (c.f., FIG. 5), will not be elaborated upon here.

The heat dissipation plate 12 is disposed on the bottom surface of the housing 15, and provided to partly extend beyond the housing 15 to reach the outside. The heat dissipation plate 12 has a thickness lack portion 13 in a location where the heat dissipation plate 12 extends beyond the housing 15 to reach the outside. That is, the thickness lack portion 13 of the heat dissipation plate 12 extends all across the externally extending site including a location facing the screw 9. The thickness lack portion 13 is thinner than the other parts of the heat dissipation plate 12.

As such, the semiconductor device 1 in the first embodiment has a longer distance between the screw 9 and the heat dissipation plate 12 than the semiconductor device 23 in the fundamental technique. Consequently, the semiconductor device 1 in the first embodiment is smaller in a thickness direction of the semiconductor device 1 than the semiconductor device 23 in the fundamental technique. In addition, the semiconductor device 1, which has sufficient insulation properties between the screw 9 and the heat dissipation plate 12 without additional members, is less costly.

Second Embodiment

Figure 2:
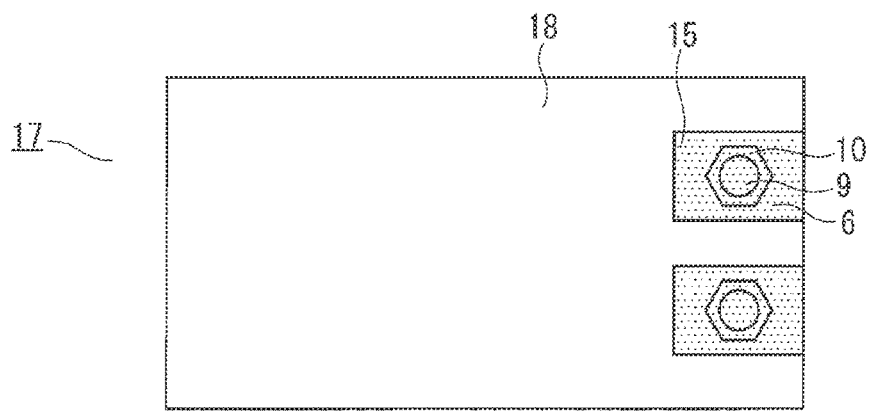
FIG. 2 is a diagram illustrating one example of a configuration of a semiconductor device according to a second embodiment of the present invention.

FIG. 2 is a diagram illustrating one example of a configuration of a semiconductor device 17 according to a second embodiment of the present invention, and is a diagram of the semiconductor device 17 when viewed from, a heat dissipation plate 18.

As illustrated in FIG. 2, the semiconductor device 17 according to the second embodiment includes the heat dissipation plate 18. The other components, which are the same as those in the fundamental technique (c.f., FIG. 5), will not be elaborated upon here.

The heat dissipation plate 18 is disposed on the bottom surface of the housing 15, and provided to partly extend beyond the housing 15 to reach the outside. Further, the heat dissipation plate 18 has the thickness lack portion 13 (i.e., a hatch portion of the heat dissipation plate 18 in the drawing) only in a location where the heat dissipation plate 18 extends beyond the housing 15 to reach the outside, the location facing the screw 9.

As such, the second embodiment achieves the same effects as the first embodiment; in addition, the second embodiment prevents the heat dissipation plate 18 from deformation resulting from a factor (e.g., temperature change) in shape change.

Third Embodiment

Figure 3:
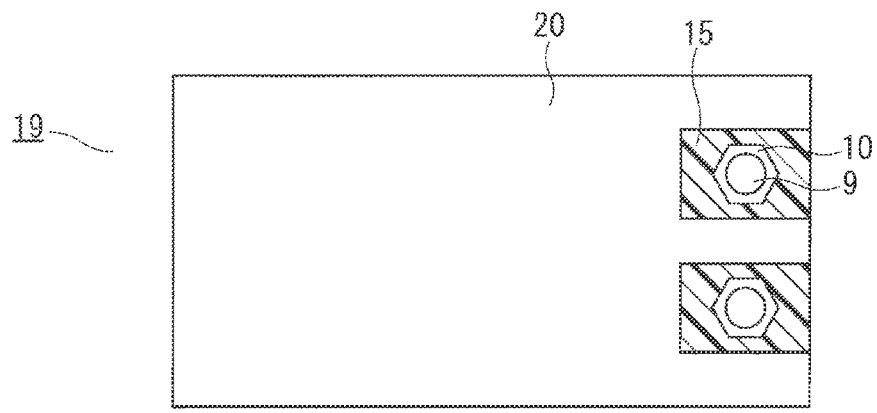
FIG. 3 is a diagram illustrating one example of a configuration of a semiconductor device according to a third embodiment of the present invention.

FIG. 3 is a diagram illustrating one example of a configuration of a semiconductor device 19 according to a third embodiment of the present invention, and is a diagram of the semiconductor device 19 when viewed from a heat dissipation plate 20.

As illustrated in FIG. 3, the semiconductor device 19 according to the third embodiment includes the heat dissipation plate 20. The other components, which are the same as those in the fundamental technique (c.f., FIG. 5), will not be elaborated upon here.

The heat dissipation plate 20 is disposed on the bottom surface of the housing 15, and provided to partly extend beyond the housing 15 to reach the outside. Further, the heat dissipation plate 20 is not disposed in a location where the heat dissipation plate 20 extends beyond the housing 15 to reach the outside, the location facing the screw 9. In the example of FIG. 3, the heat dissipation plate 20 has a cutout in the location facing the screw 9.

As such, the semiconductor device 19 in the third embodiment is smaller in a thickness direction of the semiconductor device 19 than the semiconductor device 23 in the fundamental technique. In addition, the semiconductor device 19, which has sufficient insulation properties between the screw 9 and the heat dissipation plate 12 without additional members, is less costly.

Fourth Embodiment

Figure 4:
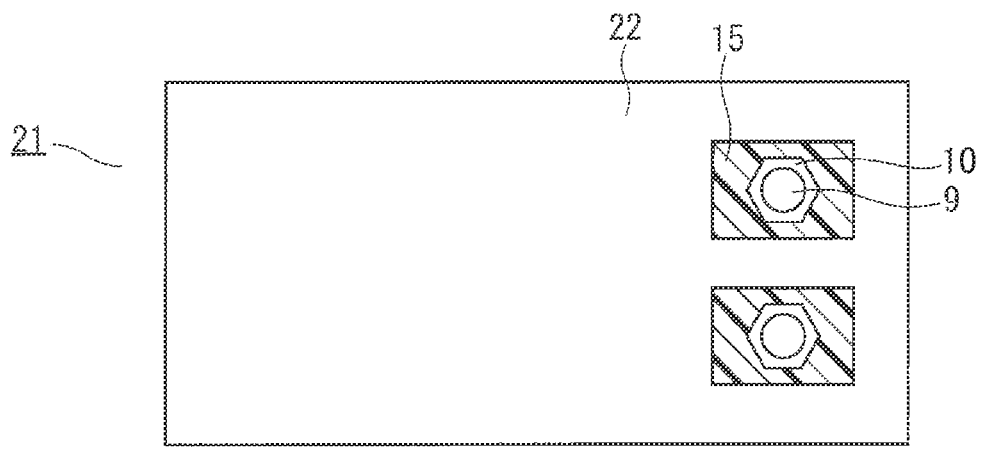
FIG. 4 is a diagram illustrating one example of a configuration of a semiconductor device according to a fourth embodiment of the present invention.

FIG. 4 is a diagram illustrating one example of a configuration of a semiconductor device 21 according to a fourth embodiment of the present invention, and is a diagram of the semiconductor device 21 when viewed from a heat dissipation plate 22.

As illustrated in FIG. 4, the semiconductor device 21 according to the fourth embodiment includes the heat dissipation plate 22. The other components, which are the same as those in the fundamental technique (c.f., FIG. 5), will not be elaborated upon here.

The heat dissipation plate 22 is disposed on the bottom surface of the housing 15, and provided to partly extend beyond the housing 15 to reach the outside. Further, the heat dissipation plate 22 has an opening surrounding a location where the heat dissipation plate 22 extends beyond the housing 15 to reach the outside, the location facing the screw 9.

As such, the fourth embodiment achieves the same effects as the third embodiment; in addition, the fourth embodiment prevents the heat dissipation plate 22 from deformation resulting from a factor (e.g., temperature change) in shape change.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 1 semiconductor device, 2 semiconductor element, 3 metal pattern, 4 solder, 5 wire, 6 electrode, 7 wire, 8 busbar, 9 screw, 10 nut, 11 insulating substrate, 12 heat dissipation plate, 13, thickness lack portion, 14 solder, 15 housing, 16 resin, 17 semiconductor device, 18 heat dissipation plate, 19 semiconductor device, 20 heat dissipation plate, 21 semiconductor device, 22 heat dissipation plate, 23 semiconductor device, and 24 heat dissipation plate.

The invention claimed is:

1. A semiconductor device comprising:
a housing containing a semiconductor element;
a heat dissipation plate disposed on a bottom surface of the housing, and provided to partly extend beyond the housing to reach an outside;
an electrode electrically connected to the semiconductor element, and provided to partly protrude from the housing to the outside in parallel with the heat dissipation plate; and
a screw penetrating the partly protruded portion of the electrode, and joined to an external terminal,
wherein the heat dissipation plate comprises a thickness lack portion at least at a location facing the screw, and the thickness lack portion is thinner than the other portions of the heat dissipation plate, at a side facing the screw.

2. The semiconductor device according to claim 1, wherein the heat dissipation plate comprises the thickness lack portion all across a site in which the heat dissipation plate extends to reach the outside, the site including the location facing the screw.

3. The semiconductor device according to claim 1, wherein the heat dissipation plate comprises the thickness lack portion only in the location facing the screw.

4. The semiconductor device according to claim 1, wherein at least a portion of each of the screw and the thickness lack portion directly face each other.

5. A semiconductor device comprising:
a housing containing a semiconductor element;
a heat dissipation plate disposed on a bottom surface of the housing, and provided to partly extend beyond the housing to reach an outside;
an electrode electrically connected to the semiconductor element, and provided to partly protrude from the housing to the outside in parallel with the heat dissipation plate; and
a screw penetrating the partly protruded portion of the electrode, and joined to an external terminal,
wherein the heat dissipation plate includes an opening at a location overlying the screw when viewed from a side at the heat dissipation plate facing opposite the screw, and a width of the opening is greater than a width of a head of the screw.

6. The semiconductor device according to claim 5, wherein the heat dissipation plate comprises a cutout in the location facing the screw.

7. The semiconductor device according to claim 5, wherein the opening surrounds the location facing the screw.

8. The semiconductor device according to claim 5, wherein at least a portion of the screw is viewable through the opening from the side at the heat dissipation plate facing opposite the screw.

* * * * *